United States Patent
Fujioka et al.

(10) Patent No.: US 6,301,173 B2
(45) Date of Patent: Oct. 9, 2001

(54) MEMORY DEVICE WITH FASTER RESET OPERATION

(75) Inventors: Shinya Fujioka; Yasuharu Sato, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/307,758

(22) Filed: May 10, 1999

(30) Foreign Application Priority Data

Sep. 24, 1998 (JP) ................................. 10-270264

(51) Int. Cl.[7] ..................................................... G11C 7/00
(52) U.S. Cl. ....................... 365/203; 365/205; 365/230.03
(58) Field of Search ............................. 365/230.03, 203, 365/205, 189.01, 230.01

(56) References Cited

U.S. PATENT DOCUMENTS

| | | | |
|---|---|---|---|
| 5,717,645 | * 2/1998 | Kengeri et al. | 365/230.1 |
| 5,822,264 | * 10/1998 | Tomishima et al. | 365/222 |
| 5,828,611 | * 10/1998 | Kaneko et al. | 365/203 |
| 5,940,339 | * 8/1999 | Shirley et al. | 365/207 |
| 6,049,493 | * 4/2000 | Kitamoto et al. | 365/203 |

\* cited by examiner

*Primary Examiner*—Hoal V. Ho
(74) *Attorney, Agent, or Firm*—Arent Fox Kintner Plotkin & Kahn, PLLC

(57) ABSTRACT

The present invention is a memory circuit having a plurality of word lines, a plurality of bit line pairs, and memory cells disposed at the cross-position thereof. The memory comprises: a sense amplifier which is shared by the first bit line pair and the second bit line pair disposed in the column direction and amplifies a voltage of the bit line pairs; a first and a second bit line transfer gates which are disposed between the sense amplifier and the first and second bit line pairs, and connects the bit line pair at the selected memory cell side to the sense amplifier; a bit line clamper, which is disposed between the first and second bit line transfer gates, is shared by the first bit line pair and the second bit line pair, and supplies the precharge level to the bit line pairs; and a bit line short circuit, which is disposed at the first and the second bit line pairs respectively and shorts the bit line pairs. According to the above structure, the reset operation involving a bit line short operation can be executed at high-speed, since the bit line short circuit is disposed for each bit line pair. Also area efficiency can be improved since the bit line clamper circuit is shared by the first and the second bit line pairs.

10 Claims, 12 Drawing Sheets

First embodiment

First embodiment

First embodiment

Second embodiment

Block diagram of FCRAM

Memory core of FCRAM

Read operation of FCRAM

Sub-bit line transfer decoder(SBLTDEC) & clamper control circuit(CLPCON)

Operation timing chart of Fig. 9

Another sub-bit line transfer decoder(SBLTDC) & clamper control circuit(CLPCON)

Another sub-bit line transfer decoder(SBLTDC) &
clamper control circuit(CLPCON)

MEMORY DEVICE WITH FASTER RESET OPERATION

BACKGROUND OF THE INVENTION

1. Field of the Invention

The present invention relates to a memory circuit, such as a dynamic RAM (DRAM), and more particularly to a memory circuit with a faster reset operation of bit lines.

2. Description of the Related Art

An increase of capacity and speed is demanded for memory devices, such as DRAM. For example, page mode and burst mode have been proposed for increasing speed. Also recently, it is proposed to decrease the random access cycle itself, which involves changing not only column addresses but also row addresses. An example is a fast cycle RAM (FCRAM, trademark of Fujitsu, Ltd.), which has a shorter cycle time of random access operation, proposed in the Nikkei Electronics, Jun. 15, 1998 issue, pages 163–171, and in the 1998 SYMPOSIUM ON VLSI CIRCUITS, DIGEST OF TECHNICAL PAPERS, pages 22–25.

FIG. 1 is a diagram depicting a circuit example of a conventional memory device. In the memory device in FIG. 1, a sense amplifier SA, a bit line clamper and short circuit BLR, and a column gate CLG are disposed between a first bit line pair BL0 and /BL0 and a second bit line pair BL1 and /BL1, which are disposed in the lateral column direction. The sense amplifier SA, the bit line clamper and short circuit BLR and the column gate CLG are shared by the first and the second bit line pairs BL0 and /BL0 and BL1 and /BL1, and are connected to the first bit line pair or the second bit line pair by conducting one of the first and second bit line transfer gates BLT0 and BLT1 disposed there between.

At a first and second cell matrices CM0 and CM1 disposed at the left and right, word lines WL0 and WL1 are disposed, and memory cells MC0 and MC1 are disposed at the cross-positions of the word lines and the bit lines. And a plurality of the circuits shown in FIG. 1 are disposed as columns in the word line direction.

The sense amplifier SA in FIG. 1 comprises N channel transistors N1, N2 and N3 and P channel transistors P1, P2 and P3, and is activated when the transistor N1 conducts responding to a sense amplifier activation signal lez at the N side, pulls down a node nsa to the ground voltage Vss, and the transistor P1 conducts responding to a sense amplifier activation signal lex at the P side, and pulls up a node psa to the internal power supply Vii. By activation of the sense amplifier, the bit line pairs are driven and amplified to the ground voltage Vss and the internal power supply Vii.

The bit line transfer gates BLT0 and BLT1 comprise N channel transisters N10 and N11 and N12 and N13 respectively, and connect the corresponding bit line pair to the sense amplifier SA and the bit line clamper and the short circuit BLR under control of respective transfer control signals Blt0 or Blt1.

In the bit line clamper and short circuit BLR, the N channel transistors N4, N5 and N6 conduct responding to a bit line reset signal bre, and the transistor N4 shorts the bit line pairs, and at the same time, the transistors N5 and N6 clamp the bit line pairs to the precharge level Vii/2, which is ½ of the internal power supply Vii. The column gate CLG comprises N channel transistors N14 and N15, which connect the bit line pairs to the data bus line pair DB and /DB responding to a column select signal c1.

According to the operation of the above mentioned conventional memory device, both of the bit line transfer gates BLT0 and BLT1 conduct in reset status, the transistors N4–N6 of the bit line clamper and short circuit BLR conduct by the bit line reset signal bre, which shorts both of the bit line pairs and sets the bit line pairs to the bit line precharge level Vii/2. If the memory cell MC0 is selected here, the bit line transfer gate BLT1 side no longer conducts, the bit line clamper and short circuit BRL is reset so that the transistors N4, N5, N6 are non-conductive, the word line WL0 is driven, and a very small voltage difference is generated between the first bit line pair BL0 and /BL0 according to the charge stored in the memory cell MC0. Then the sense amplifier activation signal lez rises and lex falls, which activates the sense amplifier SA, amplifies the very small voltage difference generated between the bit line pair BL0 and /BL0, and as a result one bit line is driven to the internal power supply Vii and the other bit line is driven to the ground voltage Vss. The bit line pair BL0 and /BL0 is connected to the data bus line pair DB and /DB responding to the column select signal c1, and a read signal is output via a read amplifier and an output circuit, which are not illustrated. When the word line WL0 falls and the memory cell MC0 is written again, the sense amplifier SA is deactivated, and at the same time, the bit line transfer gate BLT1 side becomes conductive again, and the transistors of the bit line clamper and short circuit BLR conduct responding to the bit line reset signal bre, and short and clamp the bit line pairs BL0 and /BL0 and BL1 and /BL1 to the precharge level Vii/2.

In the configuration of the memory device shown in FIG. 1, the left and right bit line pairs share one sense amplifier SA, and the bit line transfer gates BLT0 and BLT1 connect one bit line pair to the sense amplifier SA. Also, the bit line clamper and short circuit BLR, which is a circuit for resetting the bit line, is disposed next to the sense amplifier SA, and is also shared by the left and right bit line pairs. As a consequence, this configuration is effective in terms of layout efficiency when relatively long bit line pairs are connected to one sense amplifier and when the number of rows of sense amplifier SA of the memory device is small. Because a pair of memory cell arrays CM0, CM1 can share the sense amplifier row.

However, the bit line clamper and short circuit BLR is connected to the bit line pairs by way of the bit line transfer gates BLT0 and BLT1, therefore the on-resistance of the transistors N10–N13 of the bit line transfer gates makes the time for the reset operation of the bit line pairs long. Such a lengthy reset operation time makes the cycle time of the random access operation longer.

FIG. 2 is a diagram depicting another circuit example of a conventional memory device. The same numerals as in FIG. 1 are used in FIG. 2 if the parts are the same. In the example of prior art in FIG. 2, the left and right bit line pairs BL0 and /BL0 and BL1 and /BL1 disposed in the column direction, share the sense amplifier SA, just like the first example of prior art. Therefore, the bit line transfer gates BLT0 and BLT1 are disposed between the sense amplifier SA and each bit line pair respectively. As with the sense amplifier SA, the column gate CLG is also shared by both bit line pairs.

In the example of prior art shown in FIG. 2, the bit line clamper and short circuit BLR, which is a bit line reset circuit, is disposed for each bit line pair in order to increase the speed of operation to short and reset the bit line pairs to the precharge level Vii/2. In other words, the bit line clamper and short circuit BLR0 is connected to the right bit line pair BL0 and /BL0, shorts the connected bit line pair BL0 and /BL0 responding to the reset signal blt1, and clamps the bit line pair to the precharge level Vii/2. In the same way, the bit line clamper and short circuit BLR1 is connected to the left bit line pair BL1 and /BL1, shorts the connected bit line pair BL1 and /BL1 responding to the reset signal blt0, and clamps the bit line pair to the precharge level Vii/2. The respective bit line clamper and short circuit BLR0, BLR1 comprises N channel transistors for shorting N4 and N24, and N channel transistors for clamping N5 and N6, and N25 and N26 in the same way.

In the case of the example of prior art shown in FIG. 2, the same control signal blt1 controls the right bit line clamper and short circuit BLR0 and the left bit line transfer gate BLT1, and the same control signal blt0 controls the left bit line clamper and short circuit BLR1 and the right bit line transfer gate BLT0. As a consequence, the bit line clamper and short circuits BLR0 and BLR1 can directly short and clamp the respective bit line pair to the precharge level without passing through the bit line transfer gate. As a result, the reset operation time can be shorter than the example of prior art in FIG. 1.

However, the clamper circuits comprised of the transistors N5 and N6, and N25 and N26 of the above mentioned bit line clamper and short circuits BLR0, BLR1 are required, only when for example the non-selected bit lines are maintained to the precharge level (internal power supply Vii) for a long time, and the precharge level drops due to the junction leakage in the substrate of the memory device so that the short operation alone between the bit line pairs at reset cannot set the bit line pairs to the precharge level Vii/2, which is ½ of the internal power supply. Therefore, the short circuit mainly resets the bit line pairs, and the operation of the bit line clamper circuits does not influence the reset operation of the bit line pairs very much.

In the example of prior art shown in FIG. 2, on the other hand, the circuit BLR0 or BRL1, comprised of the bit line clamper circuit and the short circuit for resetting the bit lines, is disposed for each bit line pair. Therefore, in the case of a memory device where the speed of the reset operation of the bit line pairs is increased by decreasing the length of the bit line pairs, disposing a clamper circuit for each bit line pair has a negative effect on increasing integration. In other words, if the clamper circuit, which does not contribute to increasing the speed of the reset operation of bit line pairs very much, is disposed for each bit line pair, it does not contribute to increasing the speed of the reset operation, but rather decreases area efficiency.

Especially in the case of the above mentioned FCRAM which has a shorter cycle time of random access, the length of the bit line pairs is shortened by subdivision to decrease the drive operation time for the bit line pairs by the sense amplifier SA and to decrease the reset operation time of the bit line pairs. Because of this, the number of sense amplifier rows and the number of bit line pairs to share the sense amplifiers increase in the memory device as a whole. As a consequence, in the architecture of FCRAM, disposing a clamper circuit for each bit line pair, as seen in FIG. 2, drops area efficiency. Also sharing the bit line pair short circuit by the bit line pairs, as shown in FIG. 1, is a configuration which makes it difficult to decrease the reset time of the bit line pairs, as mentioned above.

Also in the case of FCRAM, decreasing the cycle time results in a more frequent reset operation, which increases power consumption. Therefore, power saving of the bit line clamper circuit and the short circuit for resetting bit lines is also demanded.

SUMMARY OF THE INVENTION

With the foregoing in view, it is an object of the present invention to provide a memory circuit by which area effi-ciency is improved and the reset operation time of the bit line pairs is decreased.

It is another object of the present invention to provide a memory circuit by which the reset operation time of the bit line pairs is decreased and the power consumption of the reset operation is saved.

It is still another object of the present invention to provide a memory circuit by which the cycle time of random access is decreased and power is saved.

In order to achieve the above mentioned objects, the present invention is a memory circuit having a plurality of word lines, a plurality of bit line pairs, and memory cells disposed at the cross-position thereof comprising: a sense amplifier which is shared by the first bit line pair and the second bit line pair disposed in the column direction and amplifies a voltage of the bit line pairs; a first and a second bit line transfer gates which are disposed between the sense amplifier and the first and second bit line pairs, and connects the bit line pair at the selected memory cell side to the sense amplifier; a bit line clamper, which is disposed between the first and second bit line transfer gates, is shared by the first bit line pair and the second bit line pair, and supplies the precharge level to the bit line pairs; and a bit line short circuit, which is disposed at the first and the second bit line pairs respectively and shorts the bit line pairs.

According to the above mentioned invention, the reset operation involving a bit line short operation can be executed at high-speed, since the bit line short circuit is disposed for each bit line pair. Also area efficiency can be improved since the bit line clamper circuit is shared by the first and the second bit line pairs.

The above mentioned invention is also characterized in that a sense amplifier driver for driving the sense amplifier is commonly disposed for a plurality of sense amplifiers. This can improve the area efficiency of the sense amplifier.

The above mentioned invention is also characterized in that the memory circuit further comprises a first internal power supply, wherein the sense amplifier amplifies one of the bit line pairs to the first internal power supply, the first and second bit line transfer gates comprise transfer transistors disposed between the sense amplifier and the first and second bit line pairs, a transfer control signal for driving the transfer transistors is controlled to be a voltage higher than the first internal power supply, the bit line clamper comprises clamper transistors disposed between the precharge level terminal and the bit line pairs, and a clamper control signal for driving the clamper transistors is controlled to be a voltage lower than the transfer control signal.

According to the above invention, power consumption for generating the transfer control signals can be decreased.

The above mentioned invention is also characterized in that the memory circuit further comprises a first internal power supply, the sense amplifier amplifies a voltage of one of the bit line pairs to the first internal power supply, wherein the first and second bit line transfer gates comprise transfer transistors disposed between the sense amplifier and the first and second bit line pairs, a transfer control signal for driving the transfer transistors is controlled to be a voltage higher than the first internal power supply, the bit line short circuit comprise shorting transistors disposed between the bit line pairs, and a short control signal for driving the short transistors is controlled to be a voltage lower than the transfer control signals.

According to the above mentioned invention, power consumption for generating the bit line short control signals can be decreased.

In order to achieve the above mentioned objects, the second invention is a memory circuit where a first stage for decoding commands, a second stage for activating a sense amplifier, and a third stage for inputting and outputting data are in a pipeline configuration, and a plurality of data is transferred in parallel between the sense amplifier and the third stage, comprising a plurality of sub-cell matrices which are divided in the word direction and have a plurality of memory cells, a plurality of word lines and plurality of bit line pairs respectively, wherein the above sub-cell matrix further comprises: a sense amplifier which is shared by a first bit line pair and a second bit line pair disposed in the column direction and amplifies a voltage of the bit line pairs; a first and second bit line transfer gates which are disposed between the sense amplifier and the first and second bit line pairs and connects the bit line pair at the selected memory cell side to the sense amplifier; a bit line clamper which is disposed between the first and the second bit line transfer gates, shared by the first bit line pair and the second bit line pair, and supplies a precharge level to the bit line pairs; and a bit line short circuit which is disposed at the first and the second bit line pairs respectively and shorts the bit line pairs.

According to the above mentioned second invention, the bit line reset operation can be decreased and area efficiency of the cell matrix area can be improved in FCRAM which has a short cycle time of random access.

DESCRIPTION OF THE PREFERRED EMBODIMENTS

Embodiments of the present invention will now be described with reference to the accompanying drawings. The technical scope of the present invention, however, is not limited to the embodiments.

Figure 3:
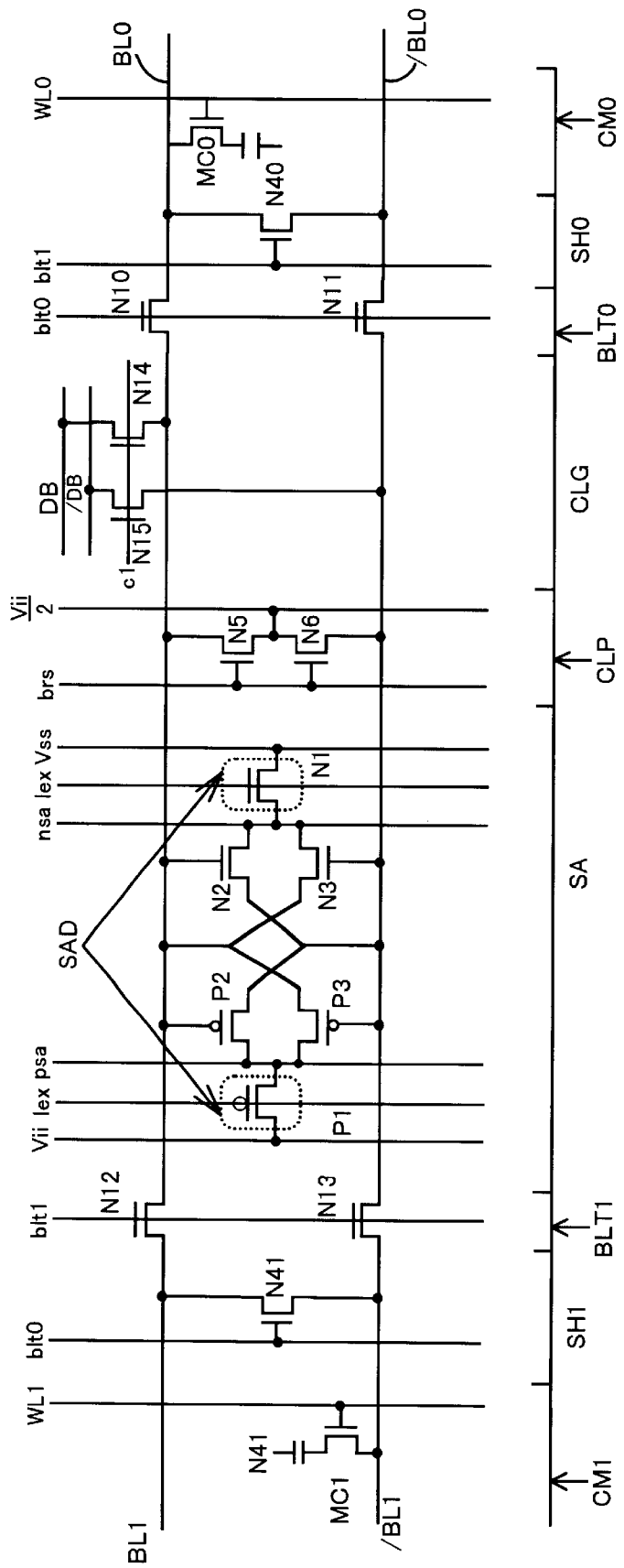
FIG. 3 is a circuit diagram of a memory device in accordance with the fist embodiment of the present invention.

FIG. 3 is a circuit diagram of a memory device in accordance with the first embodiment of the present invention. In the memory device shown in FIG. 3, a first bit line pair BL0 and /BL0 and a second bit line pair BL1 and /BL1 disposed in the column direction share a sense amplifier SA, a bit line clamper CLP and a column gate CLG. Therefore, the sense amplifier SA, the bit line clamper CLP and the column gate CLG to be shared are connected with the first and second bit line pairs BL0 and /BL0 and BL1 and /BL1 via bit line transfer gates BLT0 and BLT1. Also, bit line short circuits SH0 and SH1 are disposed at the first and the second bit line pairs respectively. At the cross-positions of the first bit line pair BL0 and /BL0 and a word line WL0, a memory cell MC0 comprised of one transistor and one capacitor is disposed, and at the cross-positions of the second bit line pair and a word line WL1, a memory cell MC1 is disposed in the same manner.

Figure 1:
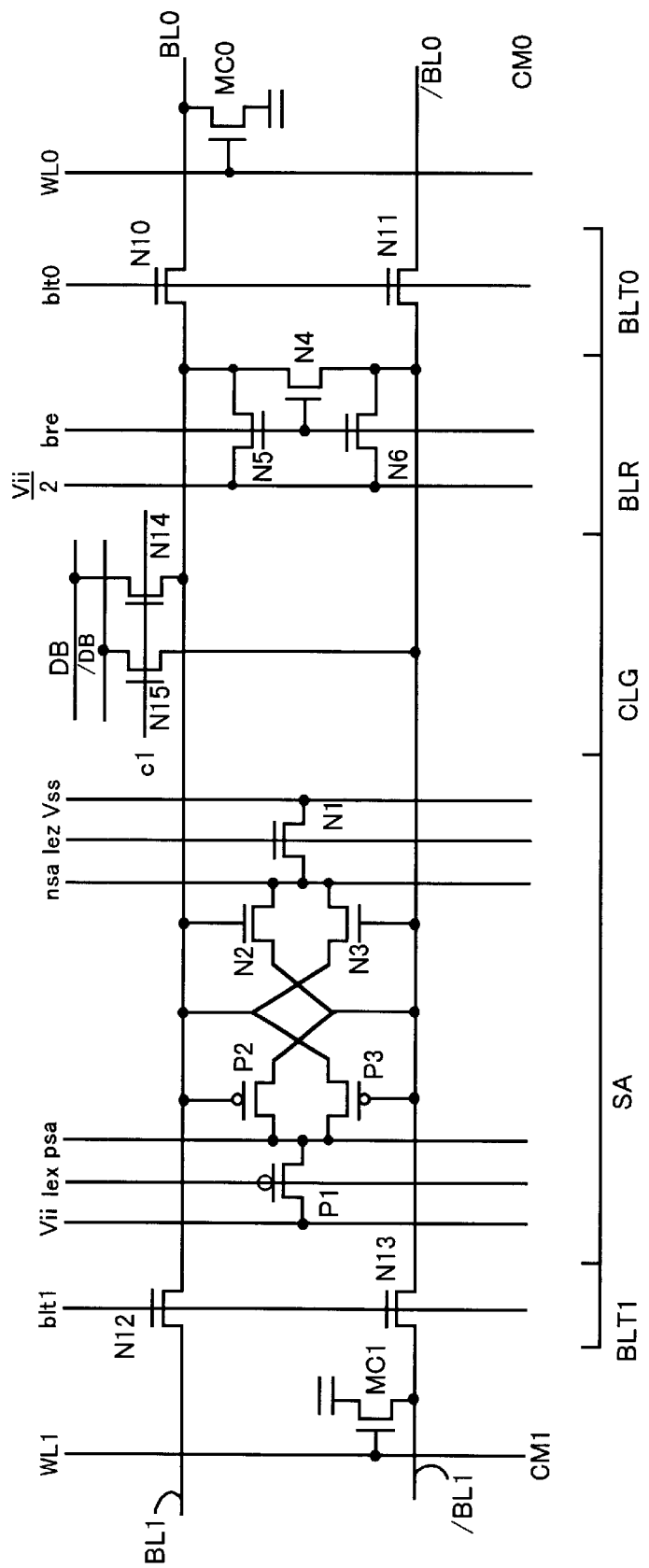
FIG. 1 is a diagram depicting a circuit example of a conventional memory device.
Figure 2:
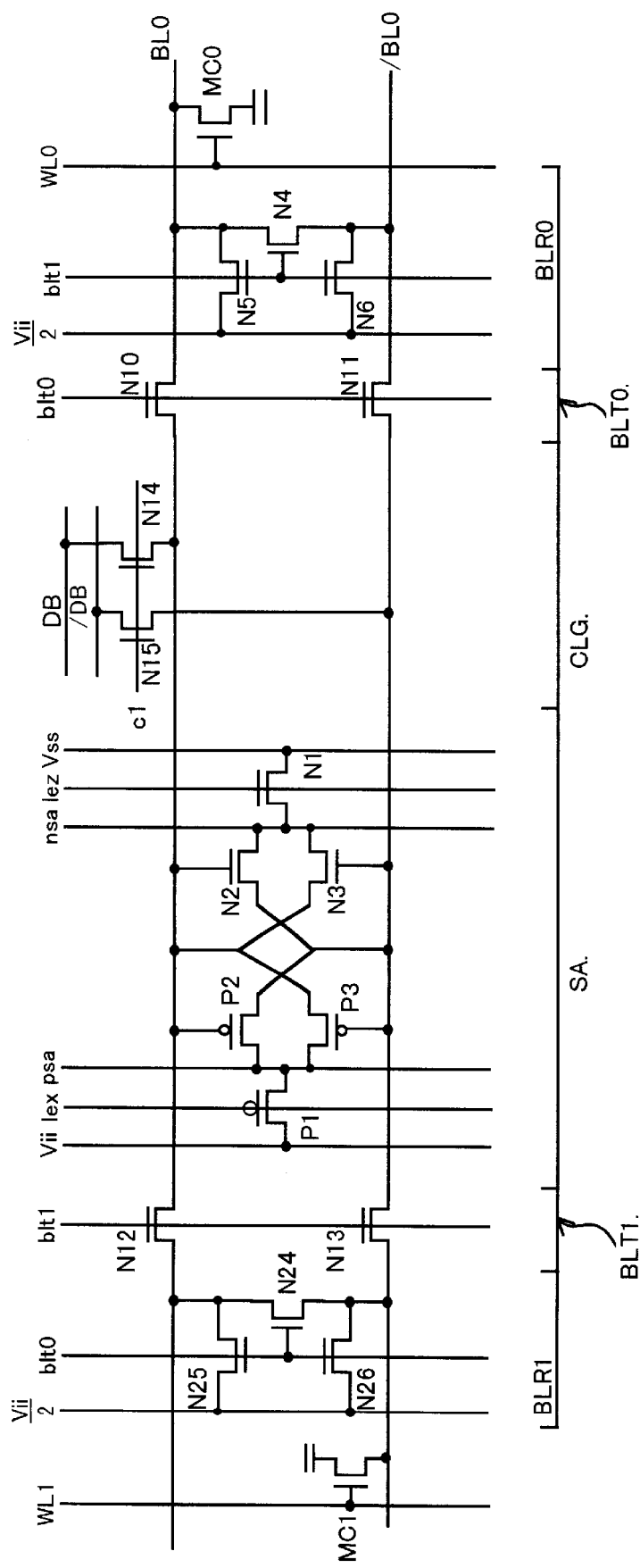
FIG. 2 is a diagram depicting another circuit example of a conventional memory device.

When a part in the circuit in FIG. 3 is used in FIG. 1 and FIG. 2, the same reference number was assigned to the part. In the case of the memory device in FIG. 3, however, the bit line short circuit SH0, SH1 is disposed at each bit line pair, unlike the example in FIG. 1. The right side bit line short circuit SH0 is comprised of an N channel transistor N40, and is controlled by a transfer control signal blt1, which controls the left side bit line transfer gate BLT1. The left side bit line short circuit SH1 is comprised of an N channel transfer N41 and is controlled by a transfer control signal blt0, which controls the right side bit line transfer gate BLT0.

And in the case of the memory device in FIG. 3, unlike the example in FIG. 2, the bit line clamper CLP is commonly disposed for the first and the second bit line pairs, is comprised of transistors N5 and N6, is controlled by a clamper control signal (or bit line reset signal) brs generated from both of the transfer control signals blt0 and blt1, and clamps one of the bit line pairs to the precharge level Vii/2. The configuration of the sense amplifier SA is the same as the examples in FIG. 1 and FIG. 2.

Figure 4:
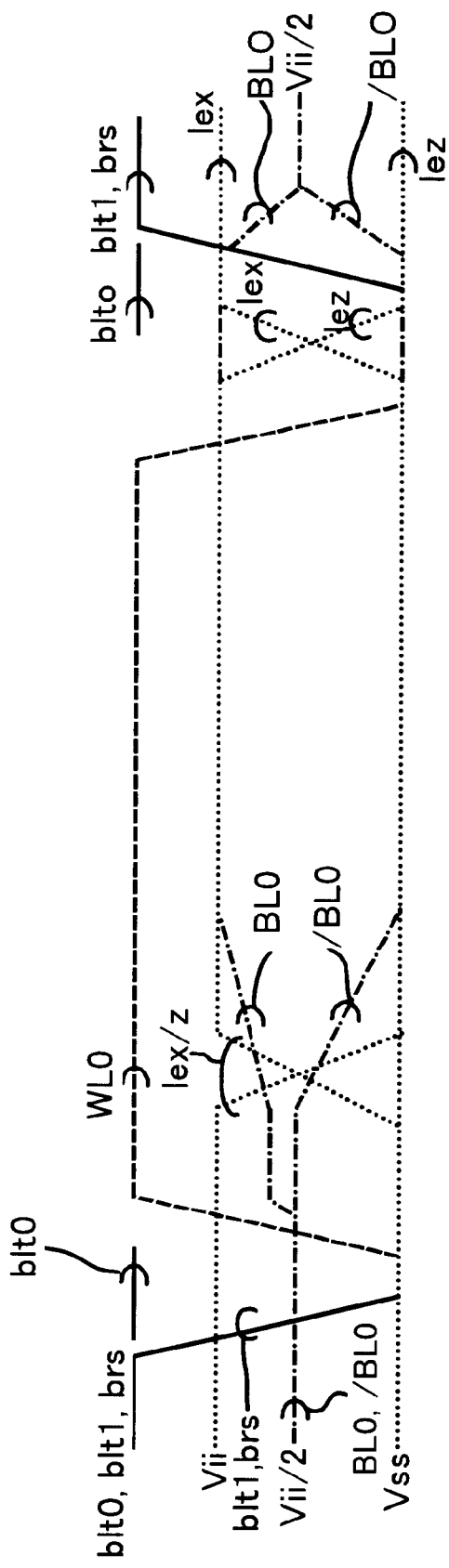
FIG. 4 is an operating waveform diagram of the memory device in FIG. 3.

FIG. 4 is an operating waveform diagram of the memory device in FIG. 3. According to FIG. 4, operation of the first embodiment in FIG. 3 is described. The following description is the case when the memory cell MC0, storing H level in the left side cell matrix CM0, is read.

At the initial reset status, both of the transfer control signals blt0 and blt1 are at the H level, which is higher than the internal power supply Vii, and the clamper control signal brs generated from the transfer control signals blt0 and blt1 is also at the H level. Therefore, both of the left and right bit line transfer gates BLT0 and BLT1 are in conducting status, the transistors N40 and N41 of the left and right bit line short circuits SH0 and SH1 are in conducting status, and the transistors N5 and N6 of the bit line clamper CLP are also in conducting status. As a result, the first and second bit line pairs are reset to the precharge level Vii/2, which is half of the internal power supply Vii.

Next, the transfer control signal blt1 and the clamper control signal brs become L level, the left side bit line transfer gate BLT1 becomes non-conductive, the transistor N40 of the right side bit line short circuit SH0 becomes non-conductive, the transistors N5 and N6 of the clamper circuit CLP also become non-conductive, and reset status ends. In this status, the first bit line pair BL0 and /BL0 is connected to the sense amplifier SA via the bit line transfer gate BLT0, which maintains conducting status.

Then the word line WL0 of the right side cell matrix CM0 is driven to the H level, which is higher than the internal power supply Vii. As a result, one bit line BL0 of the first bit line pair increases for a very small voltage according to the amount of charges inside the memory cell MC0, and the other bit line /BL0 maintains the precharge level Vii/2. When a sense amplifier activation signal lez rises and lex falls, the sense amplifier driver SAD become conductive, the sense amplifier SA is activated, the very small voltage difference generated in the bit line pair BL0 and /BL0 is amplified, and one bit line BL0 is driven to the internal power supply Vii and the other bit line /BL0 is driven to the ground voltage Vss. And responding to a column select signal cl, the first bit line pair BL0 and /BL0 is connected to the data bus line pair DB and /DB via transistors N14, N15, and a read signal is output via a read amplifier and an output circuit, which are not illustrated but connected to the data bus lines DB, /DB.

When the word line WL0 falls and the memory cell MC0 is rewritten, the sense amplifier activation signal lez falls and lex rises, the sense amplifier driver SAD becomes non-conductive and the sense amplifier SA is deactivated. And the transfer control signal blt1 and the clamper control signal brs rise, the left side bit line transfer gate BLT1 conducts, the short circuit SH0 shorts the first bit line pair, and the clamper circuit CLP clamps both of the bit line pairs to the precharge level Vii/2. In other words, both the bit line short circuit and the bit line clamper, which are circuits to reset the bit lines, are activated and both of the bit line pairs are reset to the precharge level Vii/2.

As described above, in the memory device shown in FIG. 3, the bit line short circuits SH0 or SH1 for shorting the bit line pairs are disposed at each bit line pair, therefore the bit line pairs can be shorted without passing through the bit line transfer gate BLT0, BLT1 disposed between the bit line pair and the commonly used sense amplifier. As a consequence, delay due to the conducting resistance of the transistors N10–N13 of the bit line transfer gate BLT0, BLT1 does not occur, and the speed of the reset operation of the bit line pairs can be increased. And the bit line clamper CLP, which does not contribute very much to increasing the speed of the reset operation of the bit line pairs, is shared by the first and the second bit line pairs so that area efficiency improves.

Figure 5:
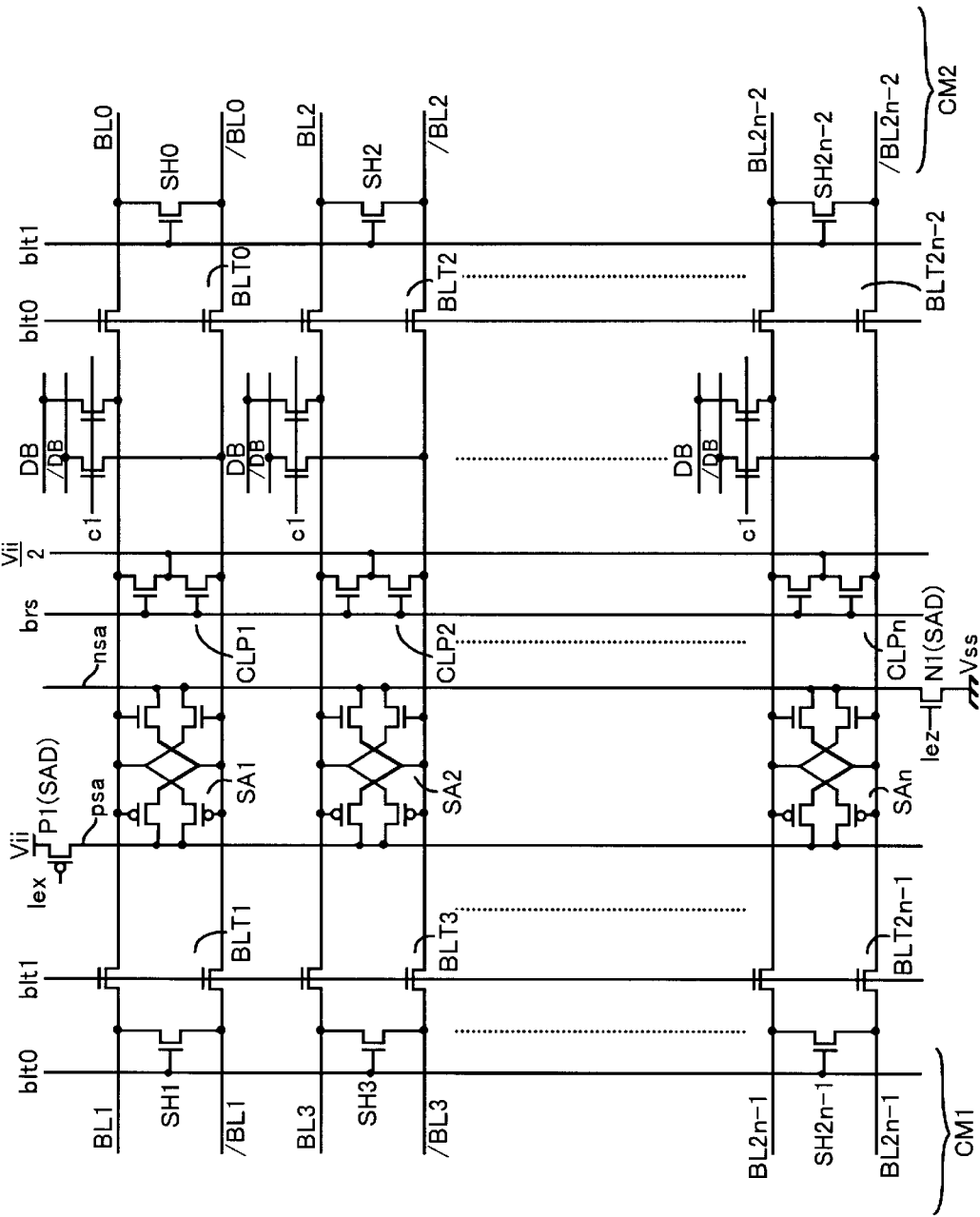
FIG. 5 is a circuit diagram of a memory device in accordance with the second embodiment.

FIG. 5 is a circuit diagram of a memory device in accordance with the second embodiment. FIG. 5 shows n pairs of the first and second bit line pairs BL0 and /BL0–BL2n−1 and /BL2n−1, where each first and second bit line pairs share sense amplifiers SA1–SAn, bit line clampers CLP1–CLPn, and column gates CLG1–CLGn. And each first and second bit line pairs have dedicated bit line short circuits SH0, SH1–SH2n−2, SH2n−1. Bit line transfer gates BLT0 and BLT1–BLT2n−2 and BLT2n−1 are disposed between the sense amplifiers SA1–SAn and the first and second bit line pairs. Each control signal is the same as the example in FIG. 3.

The difference of the second embodiment in FIG. 5 from the first embodiment is that an N channel transistor N1 and a P channel transistor P1, which are the sense amplifier drivers SAD, are commonly disposed for a plurality of sense amplifiers SA1–SAn. And the commonly disposed sense amplifier drivers SAD drive common nodes nsa and psa to the ground voltage Vss and the internal power supply Vii respectively, by which the plurality of the sense amplifiers SA1–SAn are activated.

In this way, in the second embodiment, the sense amplifier drivers SAD are commonly disposed for the plurality of sense amplifiers, which can improve area efficiency. In the case of a memory device whose architecture has small numbers of sense amplifiers SA, the activation speed of the sense amplifiers SA can be maintained at a sufficiently fast speed, even if the sense amplifier drivers SAD are commonly disposed, as described above.

Figure 6:
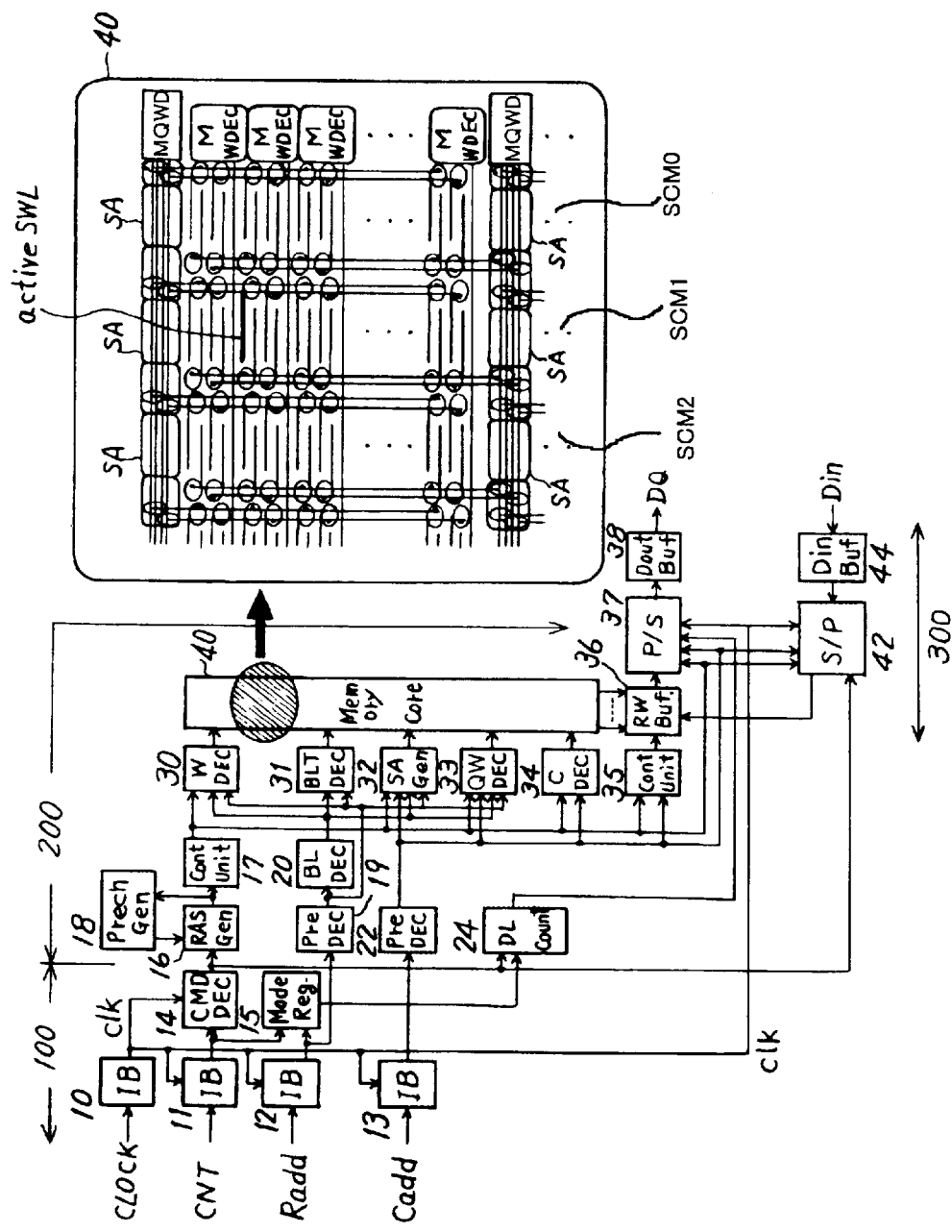
FIG. 6 is a general block diagram of FCRAM.

FIG. 6 is a general block diagram of FCRAM which has a shorter cycle time of random access. If the above mentioned memory devices, in accordance with the first and second embodiments, are applied to an FCRAM where the configuration of the memory core area is subdivided, the bit line pair reset operation is decreased and the cycle time of random access is decreased, the speed of the reset operation to the bit line pairs can be increased and area efficiency can be improved.

Next, the general configuration of the FCRAM in FIG. 6 is described. At first, an external clock CLOCK is supplied to a clock input buffer 10, and an internal clock clk is output. Responding to the internal clock clk, a control signal CNT, row address Radd and column address Cadd are input to the respective buffers 11, 12 and 13 and are latched. Also, responding to the internal clock clk, data is output from a data output terminal DQ, and data is input from a data input terminal Din.

The control signal CNT is supplied to a command decoder 14, where the command is decoded. In initial status, responding to the control signal CNT, various mode setting values supplied from the row address terminal Radd are latched by a mode register 15. In normal operation, when the control signal CNT is decoded by the command decoder 14 and RAS activation is detected by an RAS generator 16 responding to the decoded output, a control unit 17 controls the operations of decoder and other components. Concretely, these components include a word decoder 30, bit line transfer decoder 31, sense amplifier activation circuit 32, 1/4 decoder 33, column decoder 34 and column system control unit 35.

The row address signal Radd is latched by the input buffer 12 and is predecoded by a word predecoder 19. The predecoded signals are supplied to the word decoder 30, bit line transfer decoder 31, sense amplifier activation circuit 32, 1/4 decoder 33 and block decoder 20. The column address Cadd is latched by the input buffer 13, and precoded by a column predecoder 22. The predecoded signals are supplied to the sense amplifier activation circuit 32, 1/4 decoder 33, column decoder 34, column system control unit 35, read side parallel/serial conversion circuit 37 and write side serial/parallel conversion circuit 42.

The FCRAM is divided into the first stage 100 for decoding the control signal CNT and detecting the operation mode, the second stage 200 for decoding the row address signal Radd, activating the word lines and the sense amplifier, and outputting data to the buffer circuit 36 for reading and writing in parallel, and the third stage 300 for converting the data output in parallel to the read and write buffer circuit 36 using the parallel/serial conversion circuit 37, and for outputting the data from the data output buffer 38. The third stage 300 includes a circuit for inputting the data for writing to the data input buffer 44, converting the data from serial to parallel, and supplying the data in parallel to the read and write buffer circuit. The first, second and third stages 100, 200 and 300 have a pipeline structure, so that each stage operates independently.

In the memory core 40, a memory cell comprised of one transistor and one capacitor, which are not illustrated, is disposed at the cross-position of the bit line and sub-word line SWL. The memory core 40, as described later, is divided into a plurality of sub-cell matrices SCM0, SCM1, SCM2 in the row direction (lateral direction in the figure), and the rows of the sense amplifier SA are also disposed for each sub-cell matrix. Therefore, a column address is used to select a sub-matrix. And the main word decoder 30 selects a main word line according to the row address, and out of the sub-word lines to be connected to the main word line, only the sub-word lines in the selected sub-cell matrix are activated. In the same way, the sense activation circuit activates only the sense amplifier corresponding to the selected sub-word line in the selected sub-cell matrix.

The read operation in the memory core 40 is the same as a general DRAM. In other words, the sub-word line which belongs to the main word line and is in the selected sub-cell matrix is activated. Data of the memory of the activated sub-word line is read to the bit lines, and is amplified and latched as the sense amplifier is activated. The data latched by the sense amplifier is output to the read/write buffer 36 in parallel for the burst length. Then the parallel data is converted to serial data by the parallel/serial conversion circuit 37, and is continually output from the data output buffer 38. The parallel/serial circuit 37 executes a conversion operation at timing controlled by the data latency counter 24.

The parallel/serial conversion circuit 37 outputs the necessary number of data in serial according to the burst length that is set. For a 4-bit data supplied in parallel from the read/write buffer 3, for example, 1 bit, 2 bits and 4 bits are output in serial corresponding to the 2-bit column address and burst lengths 1, 2 and 4.

One block consists of the second stage 200, the memory core 40 and the read/write buffer 36. Normally, a plurality of blocks are disposed in a memory device. Therefore in each block, the block decoder 20 is disposed, which generates a signal to indicate whether the block is selected responding to the row address signal, and supplies the signal to the word decoder 30, the bit line transfer gate decoder 31, the sense amplifier activation circuit 32 and the 1/4 decoder 33.

Figure 7:
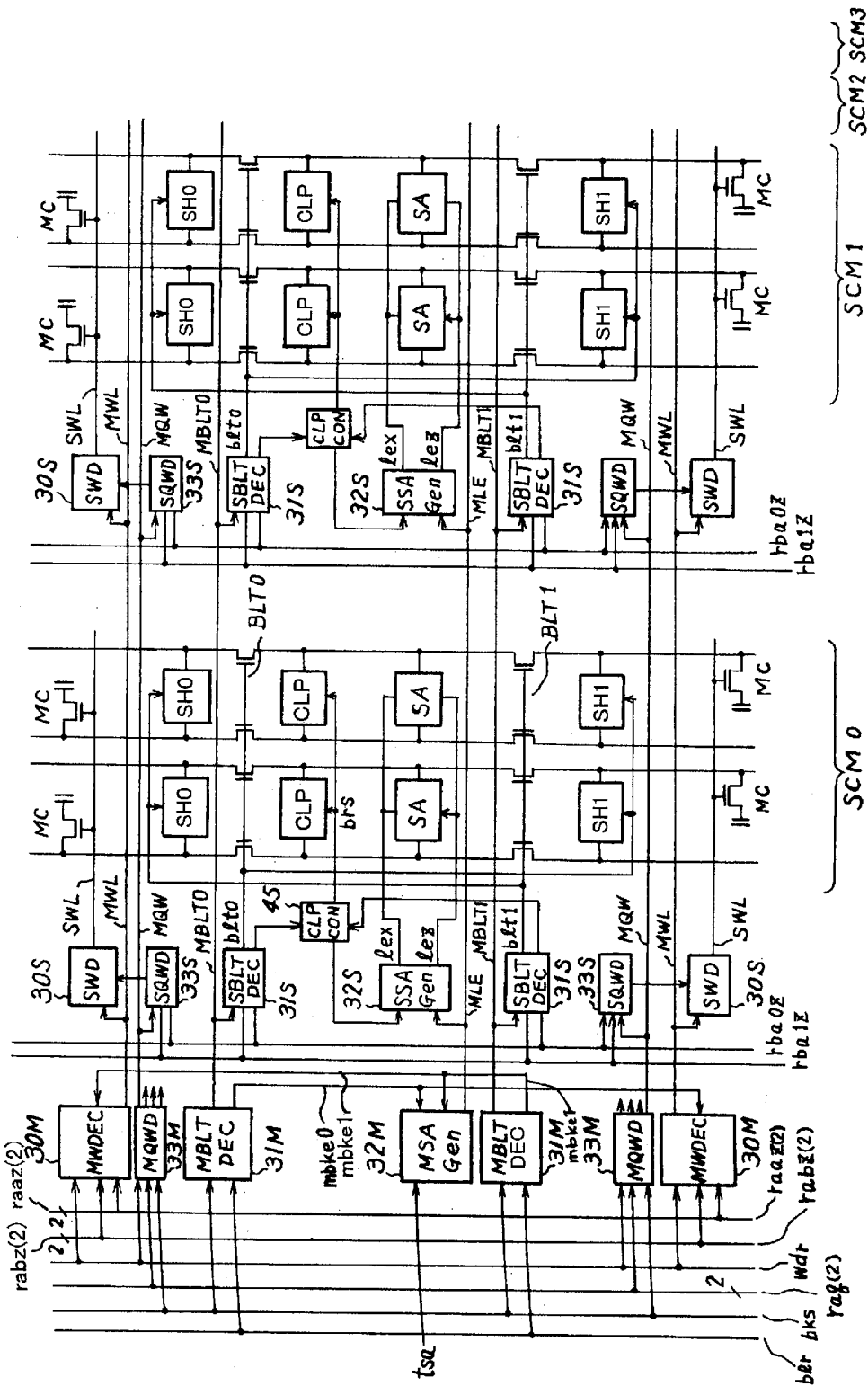
FIG. 7 is a partial circuit diagram of the memory core of the FCRAM.

FIG. 7 is a partial circuit diagram of the memory core of the FCRAM. FIG. 7 shows sub-matrices SCM0 and SCM1, which are divided in the word direction, the horizontal direction, in the memory core. The word decoder 30 comprises a main word decoder 30M commonly used by a plurality of sub-cell matrices and a sub-word decoder 30S which is disposed in each sub-cell matrix. The 1/4 decoder 33 also comprises a commonly used main 1/4 word decoder 33M and a sub 1/4 word decoder 33S which is disposed in each sub-cell matrix. Row addresses raaz and rabz, a word driver reset signal wdr, and main word block activation signals mbke0 and 1 are supplied to the main word decoder 33M, and the word driver reset signal wdr, a row address raq and a block select signal bks are supplied to the main 1/4 word decoder 33M. Column addresses rba0z and rba1z for selecting a sub-cell matrix SCM are supplied to each sub 1/4 word decoder 30S, and the main word line MWL and the output of the sub 1/4 word decoder 33S are supplied to the sub-word decoder 30S.

As a consequence, the word direction of a plurality of sub-cell matrices is selected by the main word decoder 30M. Each main word line MWL selects four sub-word decoders 30S, and each sub-word decoder 30S is selected by the output of the sub 1/4 word decoder 33S. In FIG. 7, however, only one sub-word decoder SWD is shown for the main word line MWL. When a sub 1/4 word decoder 33S is selected by the column addresses rba0z and rba1z, the selected output is supplied to the sub-word decoder 30S. As a result, only the sub-word decoder 30S selected by the main word line MWL and the sub 1/4 word decoder 33S drives the sub-word line SWL. Since the sub-word line SWL is divided for each sub-cell matrix SCM, the drive speed is fast.

The bit line transfer decoder 31, which is a transfer control circuit, comprises the main bit line transfer decoder 31M and the sub-bit line transfer decoder 31S, and the main bit line transfer decoder 31M, to which the block select signal bks and the bit line reset signal blr are supplied, and outputs the main bit line transfer signal MBLT. The sub-bit line transfer decoder 31S, to which the main bit line transfer signal MBLT and the column addresses rba0z and rba1z are supplied, outputs the transfer control signals blt0 and 1. As a consequence, only the bit line transfer gates BLT0 and BLT1 in the sub-matrix conduct.

The transfer control signals blt0 and 1 are also supplied to the bit line short circuits SH1 and SH0. As a consequence, when the bit line transfer gate BLT0 maintains conductive status and the other bit line transfer gate BLT1 becomes non-conductive, the transistor of the bit line short SH0 becomes non-conductive and ends the short of the bit line pairs. When the bit line transfer gate BLT1 maintains conductive status and the other bit line transfer gate BLT0 becomes non-conductive, on the other hand, the transistor of the bit line short SH1 becomes non-conductive.

Signals from both sub-bit line transfer gates 31S are supplied to the clamper control circuit 45, and the clamper control signal brs is generated when one of bit line transfer gates BLT0 and BLT1 is activated.

The sense amplifier activation circuit 32 comprises the main sense amplifier activation circuit 32M and the sub-sense amplifier activation circuit 32S, and the main sense amplifier activation circuit 32M, to which the main word block activation signals mbke0 and mbke1, the main bit line transfer signals MBLT0 and MBLT1, and the activation timing signal tsa are supplied, generates the main activation signal MLE. The sub-sense amplifier activation circuit 32S, to which the main activation signal MLE and the output from the clamper control circuit 45 are supplied, supplies the sense amplifier activation signals lex and lez to the sense amplifier row of the selected sub-cell matrix.

In FIG. 7, the column gate and the data bus line pair are omitted.

As described above, the feature of the memory core of FCRAM is that the memory core is divided into a plurality of sub-cell matrices SCM in the word direction, and only the sub-word line SWL in the selected sub-cell matrix is driven. Along with this, the bit line transfer gate BLT in the selected sub-cell matrix is controlled, and only the sense amplifier row, the clamper row and the short circuit row in the selected sub-cell matrix are driven. As a result, the word line driving speed is fast, the sense amplifier activation speed is fast and the reset speed is fast. By this configuration, the cycle time of random access involving changes of row addresses can be decreased.

Figure 8:
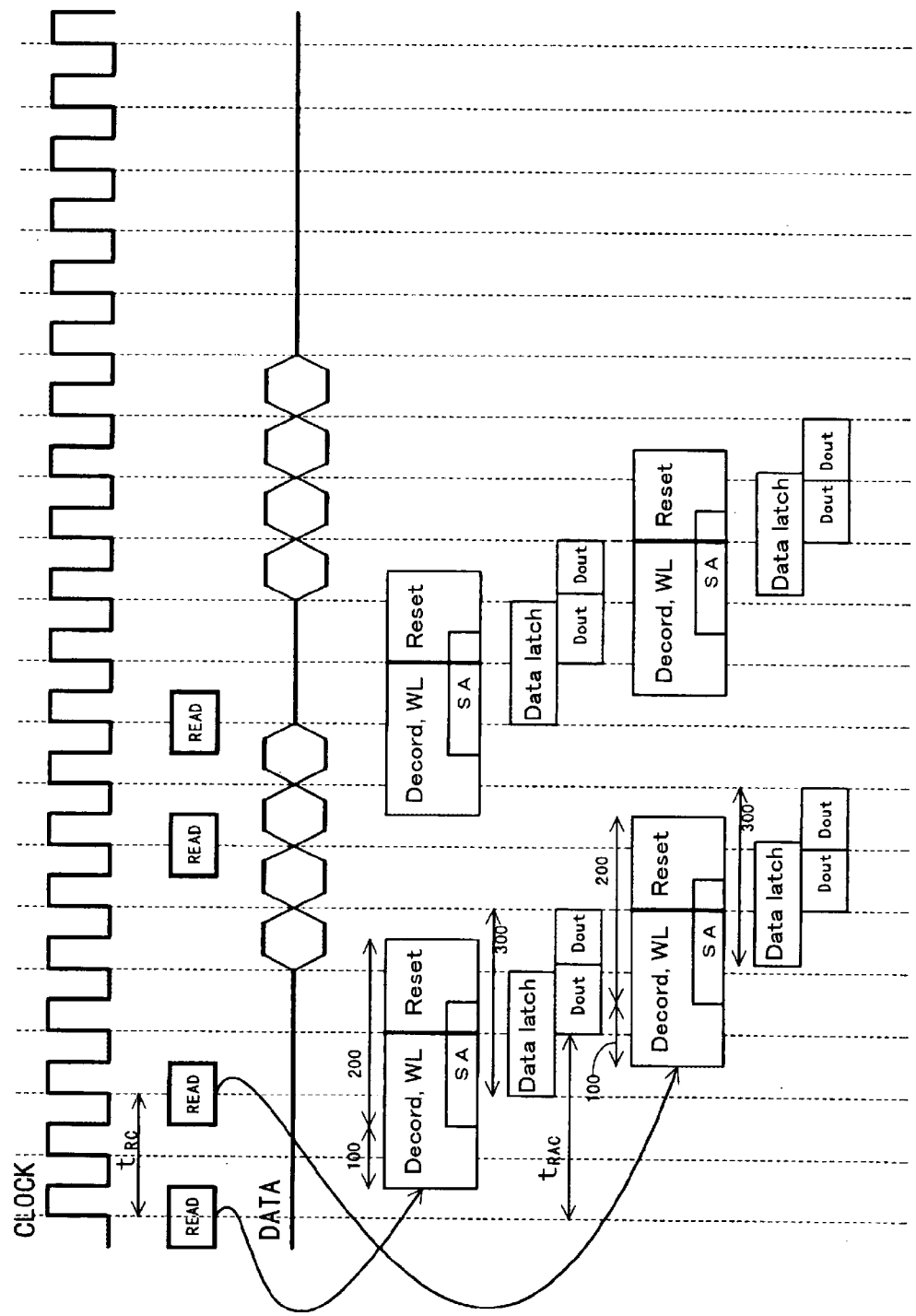
FIG. 8 is a timing chart of the read operation of the FCRAM.

FIG. 8 is a timing chart of the read operation of FCRAM. The configuration features of FCRAM are that (1) the pipeline operation is carried out by separating the first stage for receiving row addresses, column addresses and control signals and for performing the command decoding operation, and the second stage for activating and resetting the word line and the sense amplifier, (2) the memory core is divided into a plurality of sub-cell matrices and only the sub-word line and the sense amplifier of the sub-cell matrix selected by the column address are activated, and (3) a plurality of data for the burst length is transferred in batch between the sense amplifier and the third stage.

The read operation is described below according to FIG. 8. In synchronized with the read command READ, the row address Radd and the column address Cadd are simultaneously supplied by non-multiplexing, or are continuously supplied for a short time by multiplexing. The first stage 100 receives these addresses and control signals and decodes the control signals. According to the decoding result, the second stage 200 decodes the row address and the column address, drives (activates) the word line and drives (activates) the sense amplifier. Because of the above mentioned second feature, the speed of the activation operation of the word line and the sense amplifier is increased.

In the third stage 300, the data amplified and latched by the sense amplifier is output to and latched by the read/write buffer 37 in 4-bit units via the data bus of the block. And the 4-bit data is output to the parallel/serial conversion circuit 37 in parallel. The parallel/serial conversion circuit 37 outputs the necessary number of data in serial according to the preset burst length. In the example in FIG. 8, the burst length has been set to 2, and 2-bit data is output from the data output terminal DQ in serial.

When the 4-bit data is output from the read/write buffer 37 in each block to the parallel/serial conversion circuit 37 commonly disposed in the block, the reset operation (precharge operation) automatically starts in the block. In other words, the word line is deactivated, the sense amplifier is deactivated, and the potential of the bit line and the data bus line is reset (precharged). Such a reset (precharge) operation is started by the auto reset circuit 18 in FIG. 6. Since data with a plurality of bits is output to the column system circuits of the third stage 300, the period of activation of the sense amplifier can be decreased regardless the burst length. As a consequence, it is unnecessary to continue the activation status of the word line and sense amplifier until all data for the burst length is output, unlike a conventional general DRAM, and the activation operation of the word line and the sense amplifier for the next read command can be started. In other words, as FIG. 8 shows, the activation of the word line and the sense amplifier for the next read command in the second stage 200 begins immediately after the word line and the sense amplifier for the first read command are reset.

As described above, the cycle time tRC becomes shorter than the access time tRAC because of the configuration features of FCRAM. In other words, by making the first stage 100 and the second stage 200 a pipeline configuration, receiving and decoding of the address and control signals of the next cycle can begin in advance, and the period of activation of the word line and the sense amplifier can be decreased by the improvement of the memory core and the batch output of a plurality of bits from the memory core. As a result, the random access operation can also be executed in a short time.

In the above described FCRAM structure, as shown in FIG. 7, the speed of the reset operation of the bit line pairs can be increased by disposing the bit line short circuit SH for shorting the bit line pair at each bit line pair, and area efficiency of the area where the sense amplifier is disposed can be increased by sharing the clamper CLP and the sense amplifier SA by the first and second bit line pairs.

Figure 9:
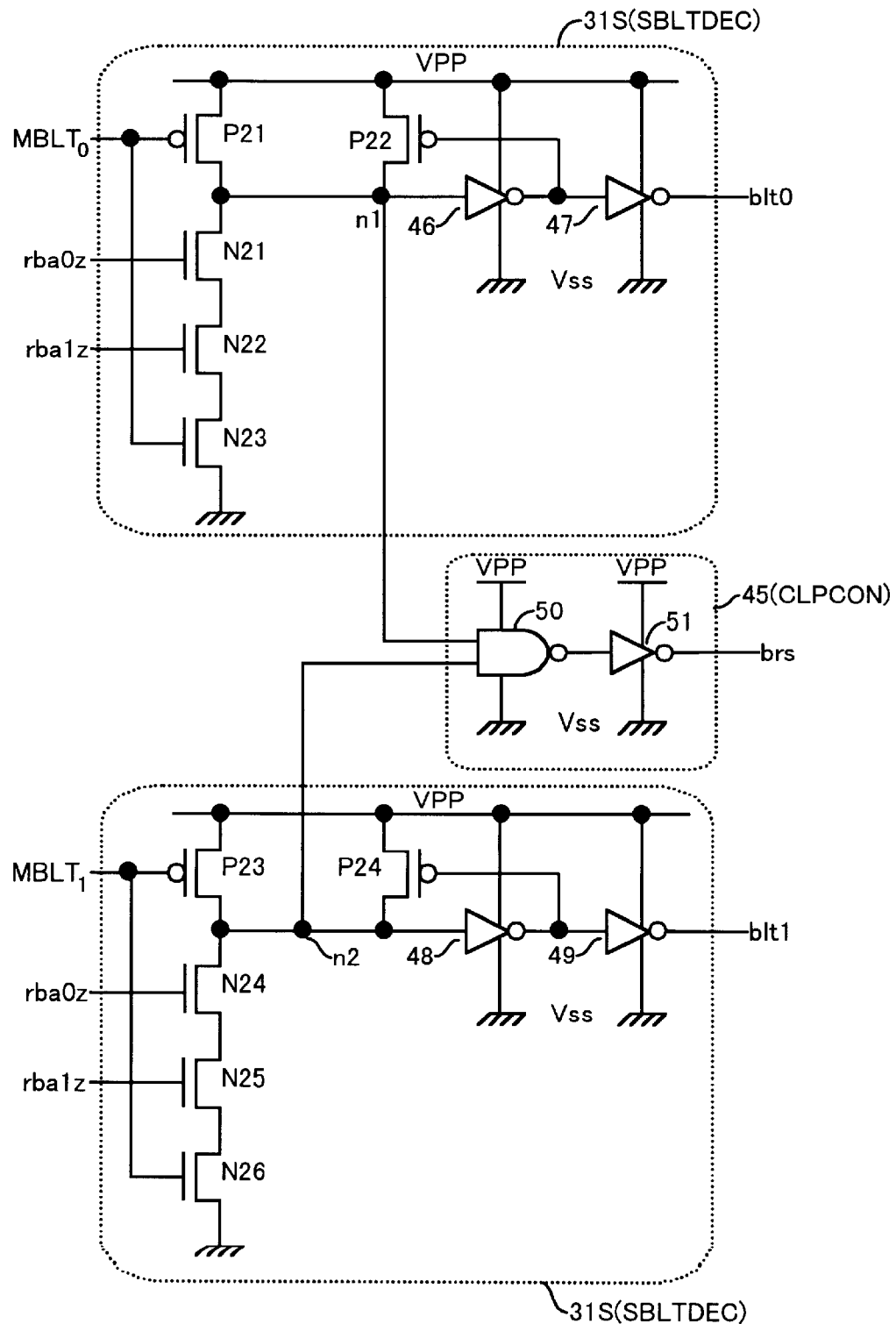
FIG. 9 is a circuit diagram of a sub-bit line transfer decoder and a clamper control circuit.

FIG. 9 is a circuit diagram of a sub-bit line transfer decoder and a clamper control circuit. The sub-bit line transfer decoder (transfer control circuit) 31S disposed at the upper side is comprised of P channel transistors P21 and P22, N channel transistors N21, N22 and N23, and inverters 46 and 47. And the sub-bit line transfer decoder generates the transfer control signal blt0. The sub-bit line transfer decoder (transfer control circuit) 31S, disposed at the bottom, has a similar configuration, and generates the transfer control signal blt1. The sub-bit line transfer decoder 31S is connected to the boosted power supply Vpp, which has a higher voltage than the internal power supply Vii, and the transfer control signals blt0 and blt1, which are output, have amplitude from the ground power supply Vss to the boosted power supply Vpp.

The clamper control circuit 45 has a NAND gate 50, which inputs nodes n1 and n2 of the sub-bit line transfer decoder 31S, and an inverter 51. The clamper control circuit is connected to the boosted power supply Vpp, and the clamper control signal brs also has an amplitude from the ground power supply Vss to the boosted power supply Vpp.

The operation of the sub-bit line transfer decoder 31S is that the main transfer control signal MBLT0 is supplied to the P channel transistor P21 and the N channel transistor N23, and the above mentioned column addresses rba0z and rba1z are supplied to the N channel transistors N21 and N22.

Figure 10:
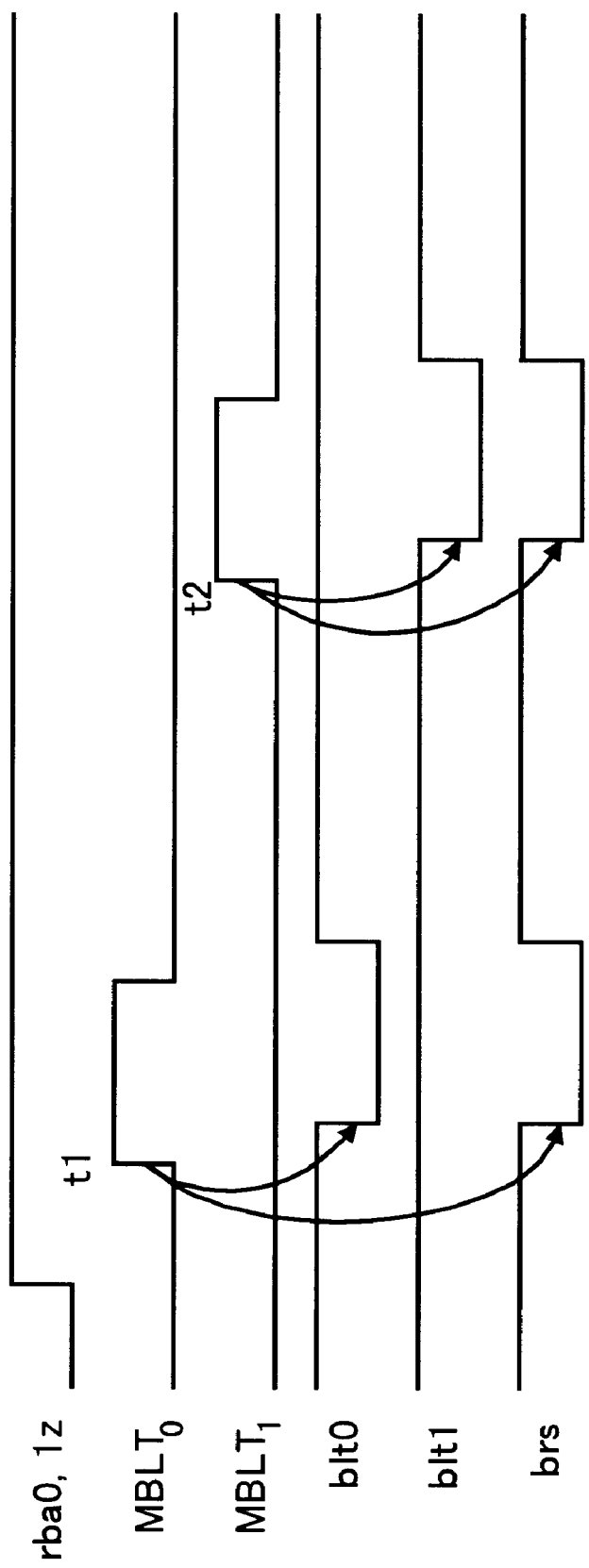
FIG. 10 is an operation timing chart of the circuit in FIG. 9.

FIG. 10 is an operation timing chart of the circuit in FIG. 9. This operation is described next according to FIG. 10.

In reset status, the main transfer control signal MBLT0 is at L level, the transistor P21 is conducted, the transistor N23 is not conducted, and the node n1 is at H level. In the same manner, the main transfer control signal MBLT1 is at L level so that the node n2 is at H level. As a result, both of the transfer control signals blt0 and blt1 become H level. In other words, both of the bit line transfer gates BLT0 and BLT1 are in a conducting state, and both of the bit line pair are shorted and reset. Because of the H level of the node n1, output of the inverter 46 becomes L level, the transistor P22 conducts, and the H level of the node n1 is latched. Also because of the H level of the nodes n1 and n2, output of the NAND gate 50 of the clamper control circuit 45 becomes L level, the clamper control signal brs becomes H level, the bit line clamper CLP is driven, and the bit line pair is clamped to the precharge level.

In activation status, the main transfer control signal MBLT1 at the selected side maintains L level at time t1. Therefore, the corresponding transfer control signal blt1 maintains H level, and the corresponding bit line transfer gate BLT1 maintains conducting status while connecting the bit line pair to the sense amplifier SA. The main transfer control signal MBLT0 at the non-selected side becomes H level. Responding to this, the transistor N23 conducts, and if both addresses rba0z and rba1z are at H level, the transistors N21 and N22 conduct and the node n1 becomes L level. As a result, the transfer control signal blt0 becomes L level, the corresponding bit line transfer gate BLT0 becomes non-conductive, and the bit line pairs at the corresponding side are disconnected from the sense amplifier SA. At the same time, the clamper control signal brs becomes L level, and the bit line clamper CLP is deactivated. The bit line short circuit disposed at the bit line pair at the selected side become non-conductive because of the L level of the transfer control signal blt0.

If at least one of the addresses rba0z and rba1z is at L level, either one of the transistors N21 or N22 becomes non-conductive, therefore, the H level of the node n2 is maintained by a latch operation and the output blt1 maintains H level. In other words, in the sub-cell matrix SCM which is not selected, the transfer control signal is not driven and the clamper control signal brs also maintains H level.

The time t2 is the case when the main transfer control signal MBLT1 becomes H level. In this case, the transfer control signal blt1 becomes L level, the corresponding bit line transfer gate BLT1 becomes non-conductive, and the bit line pair is disconnected from the sense amplifier SA. At the same time, the clamper control signal brs becomes L level which deactivates the clamper CLP.

The sub-bit line transfer decoder 31S is connected to the boosted power supply Vpp, and the transfer control signals blt0 and blt1 are driven to the boosted power supply Vpp. As a result, the gate of the transistor of the bit line transfer gate BLT becomes the boosted voltage Vpp, and the sense amplifier SA can drive one bit line up to the internal power supply Vii. The clamper control signal brs is also driven to the boosted power supply Vpp.

Figure 11:
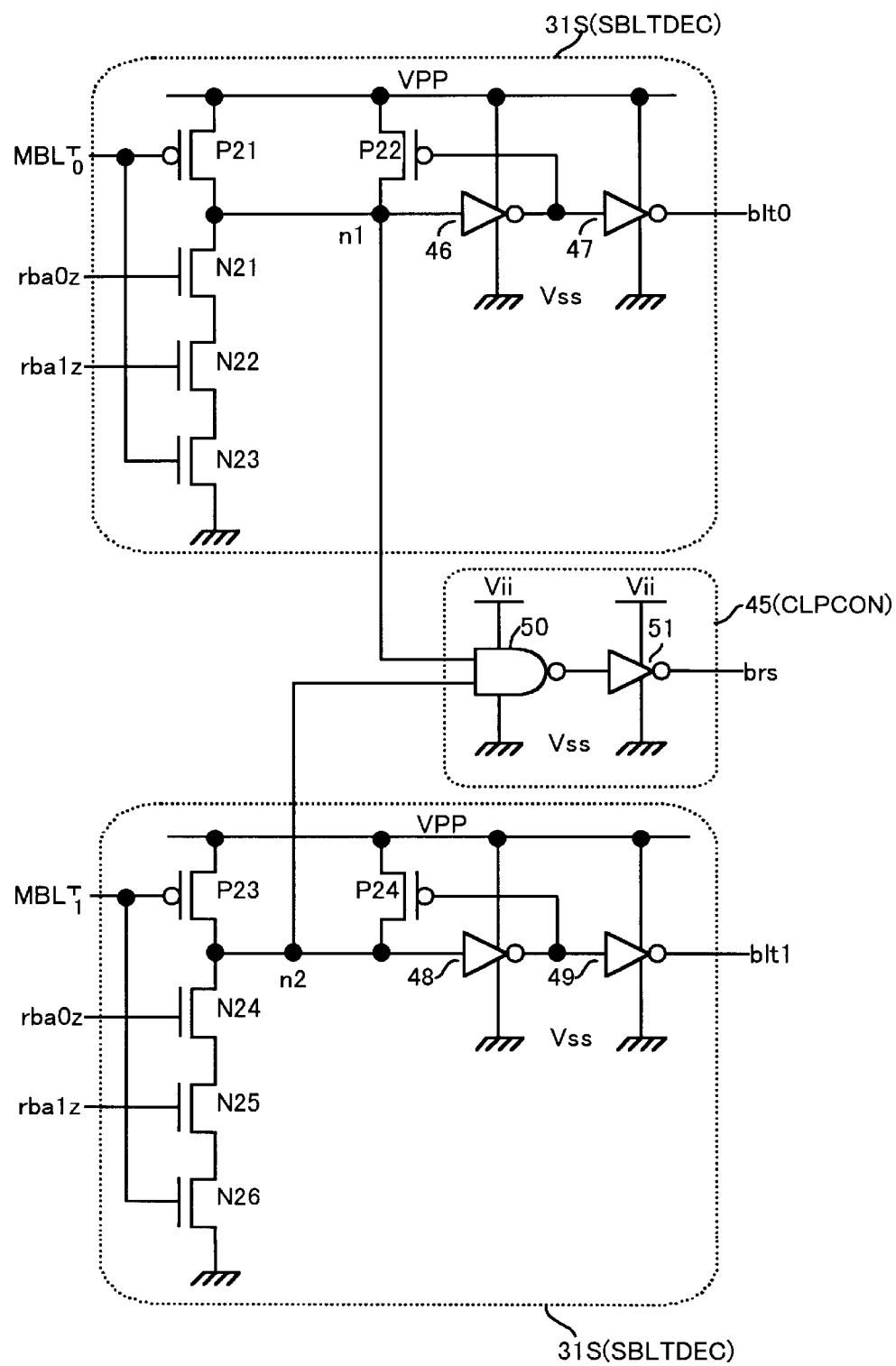
FIG. 11 is a circuit diagram (2) of the sub-bit line transfer decoder and the clamper control circuit.

FIG. 11 is a circuit diagram of another example of a sub-bit line transfer decoder and a clamper control circuit. The same reference numbers are used for parts which are the same as the circuit in FIG. 9. The difference of the example of FIG. 11 from the circuit in FIG. 9 is that the clamper control circuit 45 is not connected to the boosted power supply Vpp, but to the internal power supply Vii, which voltage is lower than Vpp. Everything else is the same. The boosted power supply vpp is generated by boosting the power supply Vcc, which is supplied from the outside. Using the boosted power supply Vpp, the internal power supply Vii, which is lower, is generated. As a consequence, voltage relationship is Vpp>Vcc, and Vpp>Vii.

The bit line clamper CLP is a circuit for clamping the bit line pair to the precharge level Vii/2, which is half of the internal power supply Vii, and the gate voltage of the transfer need not be the boosted power supply Vpp. Therefore in the example in FIG. 11, the internal power supply Vii, which is low, is selected for the power supply of the clamper control circuit 45, so that the H level of the clamper control signal brs can be the internal power supply Vii, which is lower than the boosted power supply Vpp, and as a result, the power consumption can be decreased. This means that the current consumption of the boosted power supply Vpp can be decreased. In the case of FCRAM, such a decrease in power consumption is important. In other words, for FCRAM, which has a short cycle time, the cycle of the internal reset operation and the active operation is short. This increases overall power consumption. As a result, it is important for FCRAM to decrease power consumption as much as possible by adopting such a circuit as shown in FIG. 11.

Figure 12:
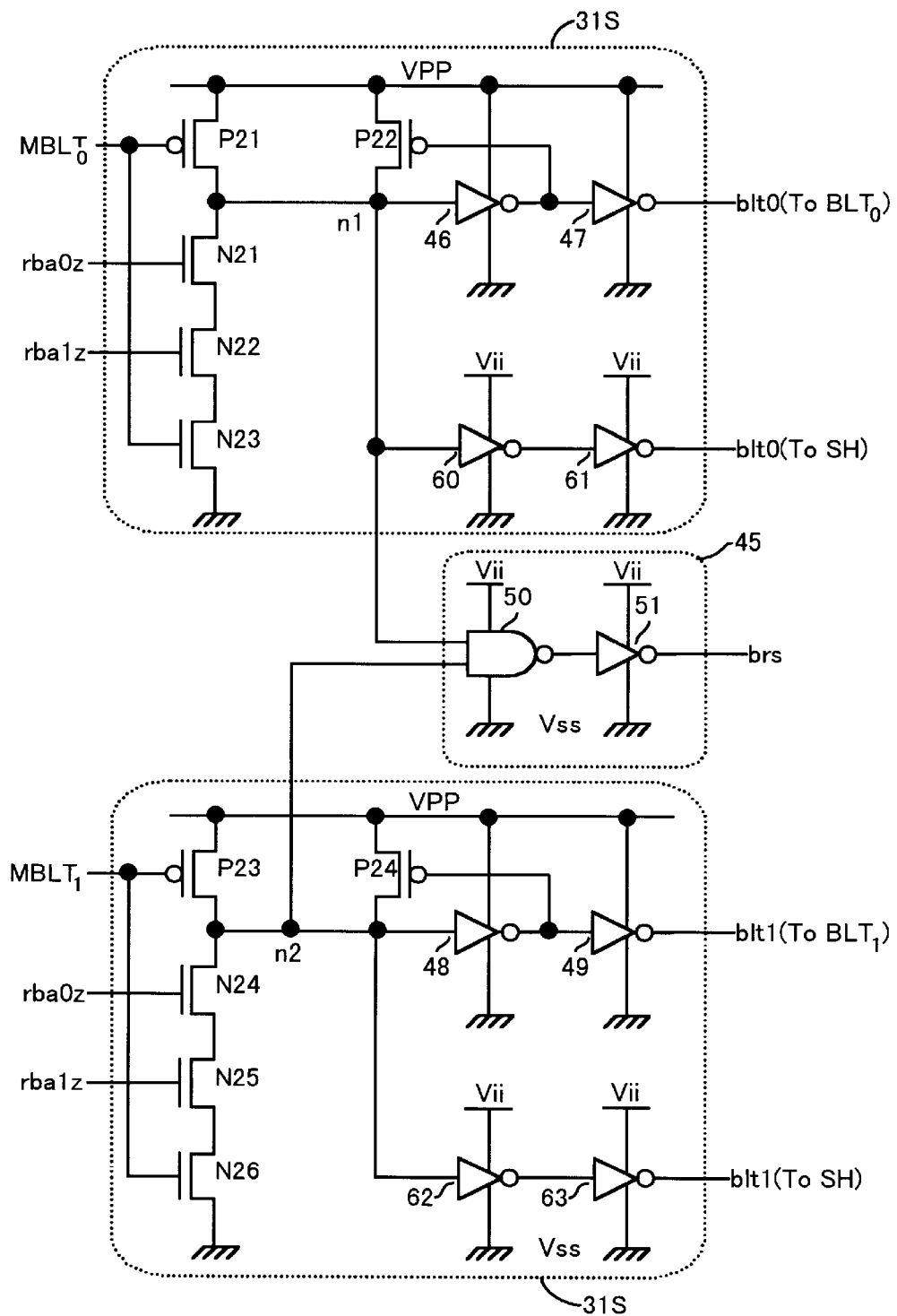
FIG. 12 is a circuit diagram (3) of the sub-bit line transfer decoder and the clamper control circuit.

FIG. 12 is a circuit diagram of another example of a sub-bit line transfer decoder and a clamper control circuit. The same reference numbers are used for parts which are the same as the circuit in FIG. 9. In the example in FIG. 12, the inverters 60, 61, 62 and 63, for generating the control signals blt0 and blt1 of the bit line short circuit, have been added to the sub-bit line transfer decoder 31S. To the inverters 60 to 63, the internal power supply Vii, not the boosted power supply Vpp, is connected. Therefore, the control signals blt0 and bit1 for the short circuit (to SH) are driven only to the internal power supply Vii. As a consequence, power consumption can be decreased. For the bit line short circuit as well, the gate voltage of the transistors N40 and N41 shown in FIG. 3 can be the internal power supply Vii to conduct the bit line pairs.

As described above, according to the present invention, where the bit line short circuit is disposed at each bit line pair and the bit line clamper is commonly disposed for the bit line pairs, the speed of the reset operation of the bit line pairs can be increased and area efficiency can be improved.

Also applying the above mentioned configuration to FCRAM can greatly contribute to decreasing the cycle time of FCRAM.

What is claimed is:

1. A memory circuit having a plurality of word lines, a plurality of bit line pairs, and memory cells disposed at the cross-positions thereof, comprising:
   a sense amplifier which is shared by the first bit line pair and the second bit line pair disposed in the column direction, and amplifies a voltage of the bit line pairs;
   a first and second bit line transfer gates which are disposed between said sense amplifier and the first and second bit line pairs respectively, and connects the bit line pair at the selected memory cell side to said sense amplifier;
   a bit line clamper which is disposed between said first and second bit line transfer gates, is shared by said first bit line pair and the second bit line pair, and supplies a precharge level to the bit line pairs;
   first and second short circuits which are disposed at said first and second bit line pairs respectively, and shorts the bit line pairs, wherein said bit line clamper includes a pair of clamper transistors disposed between a terminal of the precharged level and said bit lines without a short transistor between the bit lines; and further comprising
   a first and a second transfer control circuits which generate a first and second transfer control signals for conducting said first and second bit line transfer gates, wherein said second and first bit line short circuits operate responding to said first and second transfer control signals.

2. The memory circuit according to claim 1, further comprising a column gate which is shared by said first and second bit line pairs and supplies signals of said bit line pairs to a data bus line pair.

3. The memory circuit according to claim 1 or 2, wherein a sense amplifier driver for driving said sense amplifier is commonly disposed for a plurality of sense amplifiers.

4. The memory circuit according to claim 1 or 2, wherein a clamper control signal for controlling said bit line clamper is generated according to a first and second short control signals for controlling said first and second bit line short circuits respectively.

5. The memory circuit according to claim 1, further comprising a first internal power supply, wherein
   said sense amplifier amplifies a voltage of one of said bit line pairs to said first internal power supply,
   said first and second bit line transfer gates comprises transistors for transfer disposed between said sense amplifier and said first and second bit line pairs, a transfer control signal for driving the transistors for transfer is controlled to a voltage higher than said first internal power supply, and
   a clamper control signal for driving the clamper transistors is controlled to be a voltage lower than said transfer control signal.

6. The memory circuit according to claim 1, further comprising a first internal power supply, wherein
   said sense amplifier amplifies a voltage of one of said bit line pairs to said first internal power supply,
   said first and second bit line transfer gates comprise transistors for transfer disposed between said sense amplifier and said first and second bit line pairs, a transfer control signal for driving the transistors for transfer is controlled to be a voltage higher than said first internal power supply,
   said bit line short circuit comprises transistors for shorting disposed between said bit line pairs, and a short control signal for driving the transistors for shorting is controlled to be a voltage lower than said transfer control signals.

7. A memory circuit, in which a first stage for decoding commands, a second stage for activating a sense amplifier, and a third stage for inputting and outputting data are in pipeline configuration, and a plurality of data is transferred in parallel between said sense amplifier and the third stage, comprising:

a plurality of sub-cell matrices which are divided in the word direction and have a plurality of memory cells, a plurality of word lines, and a plurality of bit line pairs respectively, wherein said sub-cell matrix further comprises:

a sense amplifier which is shared by a first bit line pair and a second bit line pair disposed in the column direction and amplifies a voltage of the bit line pairs;

a first and second bit line transfer gates which are disposed between said sense amplifier and the first and second bit line pairs and connect the bit line pair at the selected memory cell side to said sense amplifier;

a bit line clamper which is disposed between said first and second bit line transfer gates, shared by said first bit line pair and the second bit line pair, and supplies precharge level to the bit line pairs; and a bit line short circuit which is disposed at said first and second bit line pairs respectively and shorts the bit line pairs.

8. The memory circuit according to claim 7, further comprising a column gate which is shared by said first and second bit line pairs and supplies signals of said bit line pairs to a data bus line pair.

9. The memory circuit according to claim 7 or 8, wherein a transfer control signal for controlling said bit line transfer gate is driven by a first voltage, and a clamper control signal for controlling said bit line clamper is driven to be a voltage lower than said first voltage.

10. The memory circuit according to claim 7 or 8, wherein a transfer control signal for controlling said bit line transfer gate is driven by a first voltage, and a short control signal for controlling said bit line short circuit is driven to be a voltage lower than said first voltage.

* * * * *